US008970310B2

(12) United States Patent
Breslin et al.

(10) Patent No.: US 8,970,310 B2
(45) Date of Patent: Mar. 3, 2015

(54) MONOLITHIC BAND SWITCHED COUPLED PUSH-PUSH OSCILLATOR

(71) Applicant: Analog Devices, Inc., Norwood, MA (US)

(72) Inventors: James Breslin, Cork (IE); Michael F. Keaveney, Co Limerick (IE)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 13/649,046

(22) Filed: Oct. 10, 2012

(65) Prior Publication Data

US 2014/0097910 A1 Apr. 10, 2014

(51) Int. Cl.
*H03K 3/282* (2006.01)
*H03B 5/12* (2006.01)

(52) U.S. Cl.
USPC ....... 331/56; 331/108 C; 331/114; 331/117 R

(58) Field of Classification Search
USPC ....... 331/46, 56, 107 P, 108 A, 108 C, 108 D, 331/114, 116 FE, 116 M, 116 R, 117 FE, 331/117 R, 154, 158, 167
See application file for complete search history.

(56) References Cited

U.S. PATENT DOCUMENTS

| | | | | |
|---|---|---|---|---|
| 3,839,685 A | * | 10/1974 | Borsa et al. | 331/114 |
| 4,485,355 A | * | 11/1984 | Scott | 331/117 FE |
| 4,677,691 A | * | 6/1987 | Scott | 455/318 |
| 4,754,236 A | * | 6/1988 | Mamodaly et al. | 331/117 FE |
| 4,977,379 A | * | 12/1990 | Kielmeyer | 331/56 |
| 5,138,284 A | * | 8/1992 | Yabuki et al. | 331/56 |
| 5,231,361 A | * | 7/1993 | Smith et al. | 331/56 |
| 5,418,500 A | * | 5/1995 | Igarashi | 331/76 |
| 6,326,854 B1 | * | 12/2001 | Nicholls et al. | 331/56 |
| 6,714,086 B1 | * | 3/2004 | Landrith et al. | 331/56 |
| 7,193,484 B2 | * | 3/2007 | Maeda | 331/117 R |
| 7,323,947 B2 | * | 1/2008 | Shigematsu | 331/177 V |
| 7,463,107 B2 | * | 12/2008 | Pittorino | 331/167 |
| 8,446,228 B2 | * | 5/2013 | Trotta | 331/107 SL |
| 2005/0030116 A1 | * | 2/2005 | Takagi | 331/177 V |
| 2008/0157877 A1 | | 7/2008 | Feng et al. | |
| 2008/0174378 A1 | | 7/2008 | Cusmai et al. | |

(Continued)

OTHER PUBLICATIONS

Cignani et al., "Circuit Architectures for Low-Phase-Noise Oscillators", *2002 GaAs Symposium*, pp. 77-80, Milano, Italy (Sep. 23-27, 2002).

(Continued)

*Primary Examiner* — Levi Gannon
(74) *Attorney, Agent, or Firm* — Knobbe, Martens, Olson & Bear, LLP

(57) ABSTRACT

As provided herein, in some embodiments, monolithic oscillators with low phase noise, large swing voltages, wide tuning, and high frequency characteristics are obtained by a monolithic integrated circuit having an oscillator core configured to generate a first output signal, and one or more tuning units operatively coupled to the oscillator core. In some embodiments, the oscillator core is a push-push oscillator core having a bipolar junction transistor, and each of the tuning units uses a FET transistor to present a selectable capacitance. In some embodiments, the tuning units have high-voltage and high-frequency capabilities. In some embodiments, the tuning units use MEMS switches to selectively connect capacitances to the oscillator core. In some embodiments, the oscillator core generates a second signal that has twice the frequency of the first frequency.

14 Claims, 9 Drawing Sheets

(56) References Cited

U.S. PATENT DOCUMENTS

2013/0063219 A1    3/2013  Shanan
2013/0107978 A1*   5/2013  Thaller et al. .............. 375/295

OTHER PUBLICATIONS

Chang et al., "Phase Noise in Coupled Oscillators: Theory and Experiment", *IEEE Transactions on Microwave Theory and Techniques*, vol. 45, No. 5, pp. 604-615 (May 1997).

Florian et al., "Push-Push X Band GaInP/GaAs VCO with a Fully Monolithic Microstrip Resonator", *IEEE MTT-S Digest*, pp. 1999-2002 (2004).

Gris, Marco, "Wideband Low Phase Noise Push-Push VCO", *Applied Microwave & Wireless*, pp. 28-32 (Jan. 2000).

Reddy et al., "Tuned LC Clock Buffers with Static Phase Adjust", *IEEE Radio Frequency Integrated Circuits Symposium*, pp. 519-522 (2007).

U.S. Appl. No. 13/464,522, filed May 4, 2012.
U.S. Appl. No. 13/598,429, filed Aug. 29, 2012.
U.S. Appl. No. 13/464,541, filed May 4, 2012.

Yabuki et al. VCOs for Mobile Communications. Applied Microwave [online]. Winter 1991-1992 [retrieved on Oct. 30, 2012]. Retrieved from the Internet<URL: http://www.am1.us/Protected_Papers/U11624_VCOs_for_Mobil_Comm-Yabuki.pdf> pp. 51-59.

\* cited by examiner

MONOLITHIC BAND SWITCHED COUPLED PUSH-PUSH OSCILLATOR

BACKGROUND

1. Field of the Invention

Embodiments of the invention generally relate to electronics, and in particular, to voltage-controlled oscillators.

2. Description of the Related Technology

Voltage-controlled oscillators (including digitally-controlled oscillators) are widely used in electronic and communication applications, such as clock generation and distribution, carrier synthesis, and data-recovery. Voltage-controlled oscillators can include an oscillator core that generates an oscillating output signal and a resonator or LC tank that presents the oscillator core an electrical characteristic such a capacitance and inductance that causes the oscillatory response. The frequency of oscillation depends at least partly on the value of the electrical characteristics. Accordingly, voltage-controlled oscillators have LC tanks with variable electrical characteristics, thereby providing a way to control the frequency of oscillation of the output signal by adjusting or tuning the variable electrical characteristics.

Push-push oscillators are used in many applications due to their tunable bandwidth, low noise, and low frequency pulling. Push-push oscillators may also increase tuning frequency by a factor of two. Such an oscillator represents a balanced circuit, in which two bipolar junction transistors (BJTs) provide opposite phase oscillations at the fundamental frequency and odd harmonics and in-phase oscillations at even harmonics. Push-push oscillators can be coupled with a diode-based varactor for tuning of the frequency of oscillations.

SUMMARY

Various embodiments of systems, methods and devices within the scope of the appended claims each have several aspects, no single one of which is solely responsible for the desirable attributes described herein. Without limiting the scope of the appended claims, some prominent features are described herein. After considering this discussion, and particularly after reading the section titled "Detailed Description" one will understand how the features of various embodiments are used to configure tunable oscillators that can be implemented on a monolithic integrated circuit die or chip, and achieves low phase noise, large swing voltage, band switching, and/or high frequency performance.

Prior art monolithic push-push oscillators designs are primarily limited to varactor-only tuning, which achieves relatively narrow-band tuning. Although wider-band tuning can be achieved by switching among several push-push oscillator IC dies or chips, such a system, however, does not provide a push-push oscillator with wide-band tuning on a single monolithic IC chip. Moreover, these prior art designs are largely unsatisfactory for many wide-band, high-frequency, and/or high-voltage applications.

In one embodiment, an apparatus having improved noise performance and wide-tuning-frequency and/or high-voltage capabilities is disclosed. The apparatus comprises a monolithic integrated circuit, an oscillator core of the monolithic integrated circuit, and one or more tuning units of the monolithic integrated circuit. The oscillator core includes a first oscillator configured to generate a first oscillating signal, the first oscillator having a transistor of a first structural type. The oscillator core further includes a second oscillator coupled to the first oscillator and configured to generate a second oscillating signal in anti-phase with the first oscillating signal at a fundamental harmonic and in phase with the first oscillating signal at even harmonics. The one or more tuning units of the monolithic integrated circuit are configured to present the oscillator core with a selectable electrical characteristic, wherein the one or more tuning units have one or more switching electrical devices of a second structural type that is different from the first structural type. The fundamental harmonic is based at least partly on the selected electrical characteristic presented by the one or more tuning units.

In another embodiment, the first oscillator and second oscillator of the oscillator core are in a push-push oscillator configuration. The first structural type can comprise a bipolar-junction-transistor structural type, and the second structural type can comprises a field-effect-transistor structural type. The first oscillator can have the transistor in a common collector configuration. The apparatus can further comprise a voltage-controlled capacitor operatively coupled to the oscillator core, the voltage-controlled capacitor having an adjustable capacitance. The fundamental harmonic can based at least partly on the selected electrical characteristic presented by the one or more tuning units and on the capacitance of the variable capacitor. The oscillator core can be configured to generate a third oscillating signal that has a frequency substantially twice the frequency of the fundamental harmonic. The selectable electrical characteristic can comprise a capacitance.

In another embodiment, the apparatus can comprise a control unit operatively coupled to the oscillator core and to the one or more tuning units, wherein the control unit is configured to adjust the selectable electrical characteristic to match one of the harmonics of the first oscillating signal to a reference frequency.

In some embodiment, at least one of the one or more tuning units is configured to selectively connect a capacitor to the oscillator core, the second structural type comprises a field-effect-transistor structural type, and the electrical characteristic comprises the capacitance of the capacitor connected to the oscillator. In some embodiments, at least one of the one or more tuning units is configured to selectively connect a capacitor to the oscillator core, the second structural type comprises a MEMS-switch structural type, and the electrical characteristic comprises the capacitance of the capacitor connected to the oscillator.

In some embodiments, at least one of the tuning units has a stack of two or more switching electrical devices, the stack being configured to selectively present the electrical characteristic associated with the at least one of the tuning units to the oscillator core. The monolithic integrated circuit can be provided a supply voltage, the two or more switching electrical devices of the stack can be field effect transistors, and the stack of the two or more field effect transistors can have an aggregate breakdown voltage greater than twice the supply voltage.

In yet another embodiment, a method for controlling oscillating electrical signals is disclosed. The method comprises generating a first oscillating electrical signal with a first circuit, the first circuit comprising a transistor of a first structural type. The method also comprises generating a second oscillating electrical signal with a second circuit that is coupled with the first circuit, the second oscillating electrical signal being in anti-phase with the first oscillating electrical signal at a fundamental harmonic and in phase with the first oscillating electrical signal at even harmonics. The method further comprises selectively changing an electrical characteristic of a third circuit coupled to at least one of the first circuit or the second circuit to control the fundamental harmonic. The third circuit comprises an electrical device of a second structural type that is different from the first structural type. The first circuit and second circuit can be in a push-push configuration, the first structural type can be a bipolar-junction-transistor structural type, and the second structural type can be a field-effect-transistor structural type. The push-push configuration of the first circuit and second circuit can be further configured to generate a third oscillating electrical signal having a frequency substantially twice the frequency of the fundamental harmonic. The method can further comprise selectively changing the electrical characteristic of the third circuit to perform a coarse frequency adjustment and controlling a control voltage to a varactor to perform a fine frequency adjustment.

In yet another embodiment, an apparatus is disclosed that comprises a monolithic integrated circuit, an oscillator core of the monolithic integrated circuit, and a means for adjusting a frequency of the fundamental harmonic. The oscillator core comprises a first oscillator configured to generate a first oscillating signal, the first oscillator having a transistor of a first structural type. The oscillator core further comprises a second oscillator coupled to the first oscillator and configured to generate a second oscillating signal in anti-phase with the first oscillating signal at a fundamental harmonic and in phase with the first oscillating signal at even harmonics. The adjusting means comprises an electrical device of a second structural type that is different from the first structural type. The first oscillator and second oscillator can be configured as a push-push oscillator, the first structural type is a bipolar-junction-transistor structural type, and the second structural type is a field-effect-transistor structural type. The oscillator core can be configured to generate a third oscillating signal, the third oscillating signal having a frequency substantially twice the frequency of a signal that is the difference between the first oscillating electrical signal and the second oscillating electrical signal. The electrical device of the means for adjusting the frequency of the fundamental harmonic can include a stack of two or more field effect transistors having deep trench isolation.

BRIEF DESCRIPTION OF THE DRAWINGS

These drawings and the associated description herein are provided to illustrate specific embodiments of the invention and are not intended to be limiting.

DETAILED DESCRIPTION

The various embodiments of systems, methods, and devices described herein each have several aspects, no single one of which is solely responsible for the desirable attributes described. Without limiting the scope of the claims, the more prominent features of various embodiments are described below. After considering the following one skilled in the art will understand how the features of the various embodiments provide advantages over previously available tunable oscillators.

Embodiments of the invention include, but are not limited to, monolithic oscillators with low-phase-noise and wide-tuning characteristics; monolithic oscillators with low-phase-noise and large-swing-voltage capabilities; and monolithic oscillators with low-phase-noise and high-frequency capabilities.

Figure 1A:
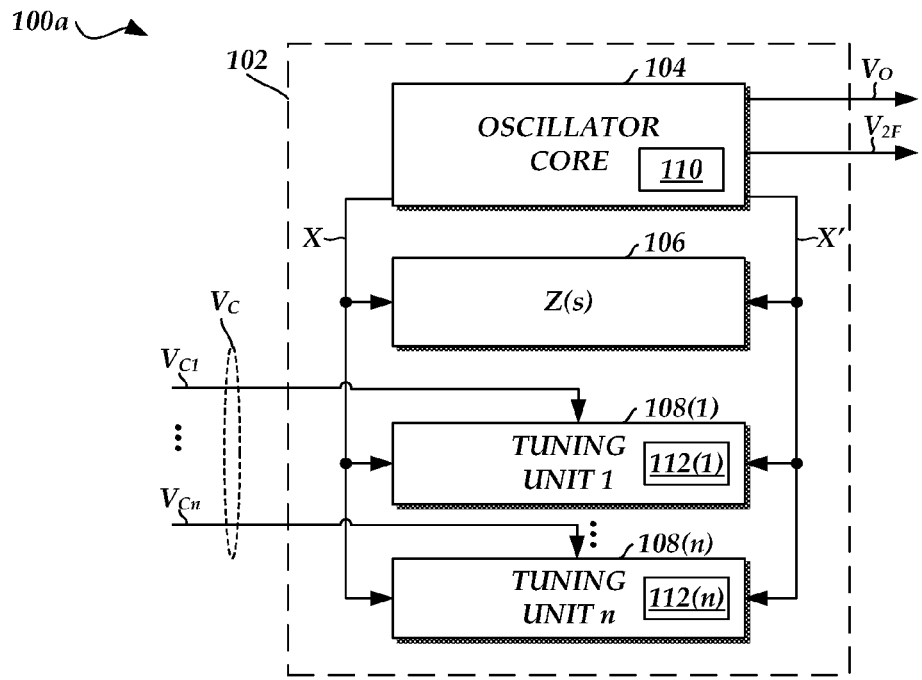
FIGS. 1a and 1b depict block diagrams of exemplary monolithic tunable oscillators including an oscillator core and one or more tuning units according to various illustrative embodiments of the invention.

FIG. 1a depicts a block diagram of an exemplary monolithic tunable oscillator 100a including a monolithic integrated circuit (IC) die or chip 102, an oscillator core 104, an impedance Z(s) 106, and one or more tuning units 108(1), . . . , 108(n), according to various illustrative embodiments of the invention. The tuning units 108(1), . . . , 108(n) are not conventional varactor circuits.

The oscillator core 104 is operatively coupled to the impedance Z(s) 106 and to the n tuning units 108(1), . . . , 108(n) across nodes X and X'. As will be explained in further detail later in connection with FIG. 2, the oscillator core 104 uses a transistor 110 to generate an oscillating signal $V_O$, and optionally a signal $V_{2F}$ that oscillates at twice the frequency of the oscillating signal $V_O$. The frequency of oscillation of the oscillating signal $V_O$ depends on the electrical characteristics of a resonator or LC tank formed by the impedance Z(s) 106 and the tuning units 108(1), . . . , 108(n). The tuning units 108(1), . . . , 108(n) use electrical devices 112(1), . . . , 112(n), respectively, to adjust the electrical characteristics presented to the oscillator core 104 across nodes X and X'. The voltage across X and X' is called the LC tank voltage. Based on their relationship with the oscillating signal $V_O$, the tuning units 108(1), . . . , 108(n) are ways of adjusting the frequency of the output of the oscillator core 104. The transistor 110 should have a structural type that is different from the structural type of the electrical devices 112(1), . . . , 112(n), as discussed below.

The oscillator core 104 can comprise a first oscillator operatively coupled with a second oscillator. The first oscillator can be configured to generate a first oscillating signal, and the second oscillator can be configured to generate a second oscillating signal. The first oscillator and the second oscillator are in anti-phase at a fundamental harmonic and odd harmonics and in phase at even harmonics. Thus, if the first and second oscillating signals are treated as a differential signal and are converted to a single ended signal $V_O$, the resulting signal $V_O$ is composed of the fundamental and odd harmonics, where the even harmonics and common mode noise have been suppressed.

In one embodiment of the invention, the monolithic IC chip 102 may be fabricated according to GaAs BiFet and/or SiGe Based BiCMOS silicon process technologies. In some embodiments, the monolithic IC chip 102 may be fabricated with a fully isolated thick silicon-on-insulator (SOI) CBiCMOS process with a high resistivity handle wafer to enable high Q factor passive components; deep trench isolated FET devices for enabling high performance FET switching devices (as discussed in connection with FIG. 3); and/or dual thick metal back-end that includes copper for enabling high Q inductors.

In operation, the monolithic IC chip 102 receives a control signal $V_C$, which can include a set of n control signals $V_{C1}, \ldots, V_{Cn}$ that control the electrical characteristics of the tuning units 108(1), ..., 108(n), respectively. Accordingly, the control signal $V_C$ can control the frequency of oscillation of the oscillating signal $V_O$. While FIG. 1a shows the control signal $V_C$ as being exogenous to the monolithic IC chip 102, in an alternative embodiment, the control signal $V_C$ is generated internally.

While FIG. 1a shows the oscillating signals $V_O$ and $V_{2F}$ as being outputs of the monolithic IC chip 102, in an alternative embodiment, the oscillating signals $V_O$ and $V_{2F}$ are internal signals of the monolithic IC chip 102. In the example shown in FIG. 1a, the oscillating signals $V_O$ and $V_{2F}$ are voltage signals. In another embodiment, the oscillating signals $V_O$ and $V_{2F}$ can be current signals.

As described above, the oscillator core 104 uses the transistor 110 to generate the oscillating signal $V_O$. The transistor 110 can have various structural types, including, but not limited to, BJT, JFET, MOSFET, IGFET, MESFET, pHEMT, HBT, and the like transistor structural types. The transistor 110 can also have various polarities, such as N-type, P-type, NPN-type, or PNP-type; and can include various semiconductor materials, such as GaAs, SiGe, and the like.

As stated, the LC tank includes the impedance Z(s) 106, which is operatively coupled to the oscillator core 104. The impedance Z(s) 106 presents the oscillator core 104 with an electrical characteristic that can be an inductance, capacitance, resistance, or a combination thereof. The impedance Z(s) 106 can be, for example, a metal-insulator-metal capacitor (MIMCap) and/or a spiral inductor implemented on the monolithic IC chip 102. In one embodiment, the impedance Z(s) 106 is substantially fixed (for example, substantially time invariant). In another embodiment, the impedance Z(s) 106 can have a time varying component. FIG. 1a shows impedance Z(s) 106 as being separate from the oscillator core 104. In other embodiments, the impedance Z(s) can be included as a subcomponent of the oscillator core 104 or separate from the monolithic tunable oscillator 100a.

As a tunable part of the resonator or LC tank, each of the tuning units 108(1), ..., 108(n) presents the oscillator core 104 with a variable or selectable electrical characteristic across nodes X and X'. The variable or selectable electrical characteristic can be a capacitance, inductance, resistance, or a combination thereof. As depicted in FIG. 1a, the tuning units 108(1), ..., 108(n) are organized in a one dimensional array. Another embodiment of the monolithic tunable oscillator 100a includes a multidimensional array (not shown) of tuning units.

The functionality of the tuning unit 108(n) described herein can be distributed among any number of circuits. For example, in some embodiments, the tuning unit 108(n) can comprise a circuit that is coupled with the first oscillator and the second oscillator of the oscillator core 104. The circuit can present an electrical characteristic (for example, a capacitance) across nodes X and X' to both the first oscillator and the second oscillator, thereby tuning or changing the fundamental harmonic. For another example, in some embodiments, the tuning unit 108(n) can comprise one or more circuits that are coupled with at least one of the first oscillator or the second oscillator of the oscillator core 104. For yet another example, in some embodiments, the tuning unit 108(n) can comprise a first single-ended circuit and a second single-ended circuit.

The first single-ended circuit is coupled to the first oscillator at, for example, node X. The first single-ended circuit can present the first oscillator an electrical characteristic across node X and ground. Similarly, the second single-ended circuit is coupled with the second oscillator at, for example, node X'. The second single-ended circuit can present the second oscillator an electrical characteristic across node X' and ground. An example of such a single-ended circuit can be a switched capacitor similar to the tuning unit 108(n) shown in FIG. 3 but with one of the X or X' nodes being ground instead of node X or X'. Thus, in combination, the first single-ended circuit and the second single-ended circuit present an electrical characteristic at nodes X and X'. Furthermore, in some embodiments a separate LC tank, not just a separate tuning unit 108(n), can be coupled independently to each of the first oscillator and the second oscillator in a similar manner where the electrical characteristic is presented across the corresponding X node or X' node to ground.

In operation, the tuning unit 108(n) adjusts its electrical characteristic in accordance with its corresponding control signal $V_{Cn}$. For example, the control signal $V_{Cn}$ can be a switching signal that switches on or off the selectable electrical characteristics of the tuning unit 108(n). In another embodiment, the control signal $V_{Cn}$ variably adjusts the electrical characteristic of the tuning unit 108(n) in a continuous manner.

In accordance with the control signal $V_{Cn}$, the tuning unit 108(n) uses the electrical device 112(n) to adjust the variable or selectable electrical characteristic thereof presented to the oscillator core 104 across nodes X and X'. The electrical device 112(n) should have a structural type that is different from the structural type of the transistor 110. Examples of the structural type of the electrical device 112(n) include, but are not limited to, BJT, JFET, MOSFET, IGFET, MESFET, pHEMT, HBT, MEMS-based switches, and the like structural types. The electrical device 112(n) can also have various polarities, such as N-type, P-type, NPN-type, or PNP-type polarities; and can include various semiconductor materials, such as GaAs, SiGe, and the like. In one embodiment, the electrical device 112(n) is a FET-type switch that switches a capacitance presented across nodes X and X'. In one embodiment, electrical device 112(n) is a FET-type amplifier that modulates a capacitance presented across nodes X and X' in a smooth manner.

Figure 1B:
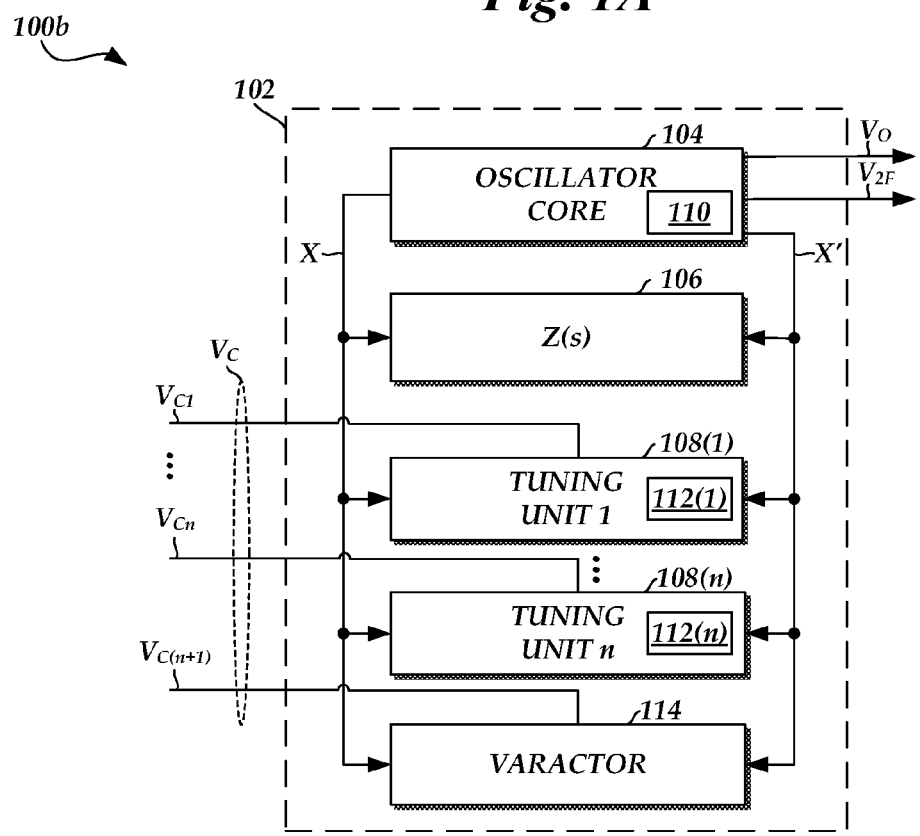

FIG. 1b depicts a block diagram of a monolithic tunable oscillator 100b that further comprises a voltage-controlled variable capacitor or varactor 114 according to another embodiment. Elements common to both monolithic tunable oscillators 100a, 100b share common reference indicia, and only differences between the monolithic tunable oscillators 100a, 100b are described herein for the sake of brevity.

As part of the LC tank, the varactor 114 can present a variable capacitance to the oscillator core 104 across nodes X and X' in accordance with a corresponding control signal $V_{C(n+1)}$. In some embodiments, the varactor 114 is a P-N junction varactor with a doping profile that substantially maximizes its on-off capacitance ratio $C_{on}/C_{off}$ and has a reverse breakdown voltage greater than a maximum voltage of the control signal $V_{C(n+1)}$. In some embodiments, the maximum voltage of the control signal $V_{C(n+1)}$ can be approximately 12 volts (V) or greater.

In one example, during operation, the tuning units 108(1), ..., 108(n) can be used for coarse tuning or adjustment of the frequency of the oscillating signal $V_O$, and the varactor 114 may be used for fine tuning or adjustment of the oscillating signal $V_O$. In embodiments in which the tuning units 108(1), ..., 108(n) comprise switchable capacitances, the applicable individual capacitances of the tuning units $108(1), \ldots, 108(n)$ can vary in a very broad range, and can be higher or lower relative to the maximum achievable capacitance of the varactor 114. Applicable values will be readily determined by one of ordinary skill in the art.

In some embodiments, where tuning units $108(1), \ldots, 108(n)$ can switch on and off, the frequency range of the oscillating signal $V_O$ depends on the ratio $C_{on}/C_{off}$ of on-off capacitance of switchable tuning units $108(1), \ldots, 108(n)$. The frequency range can also depend on the tuning range of the capacitance of the varactor 114. Increasing the frequency range of the oscillator, however, can degrade phase noise performance, resulting in a trade-off between frequency tuning range and phase noise performance. In order to mitigate the effects of this trade-off, some embodiments include multiple independent oscillators to extend the overall frequency range. In operation, one of the multiple independent oscillators can be selected based on the desired frequency of the oscillating signal $V_O$.

Figure 2A:
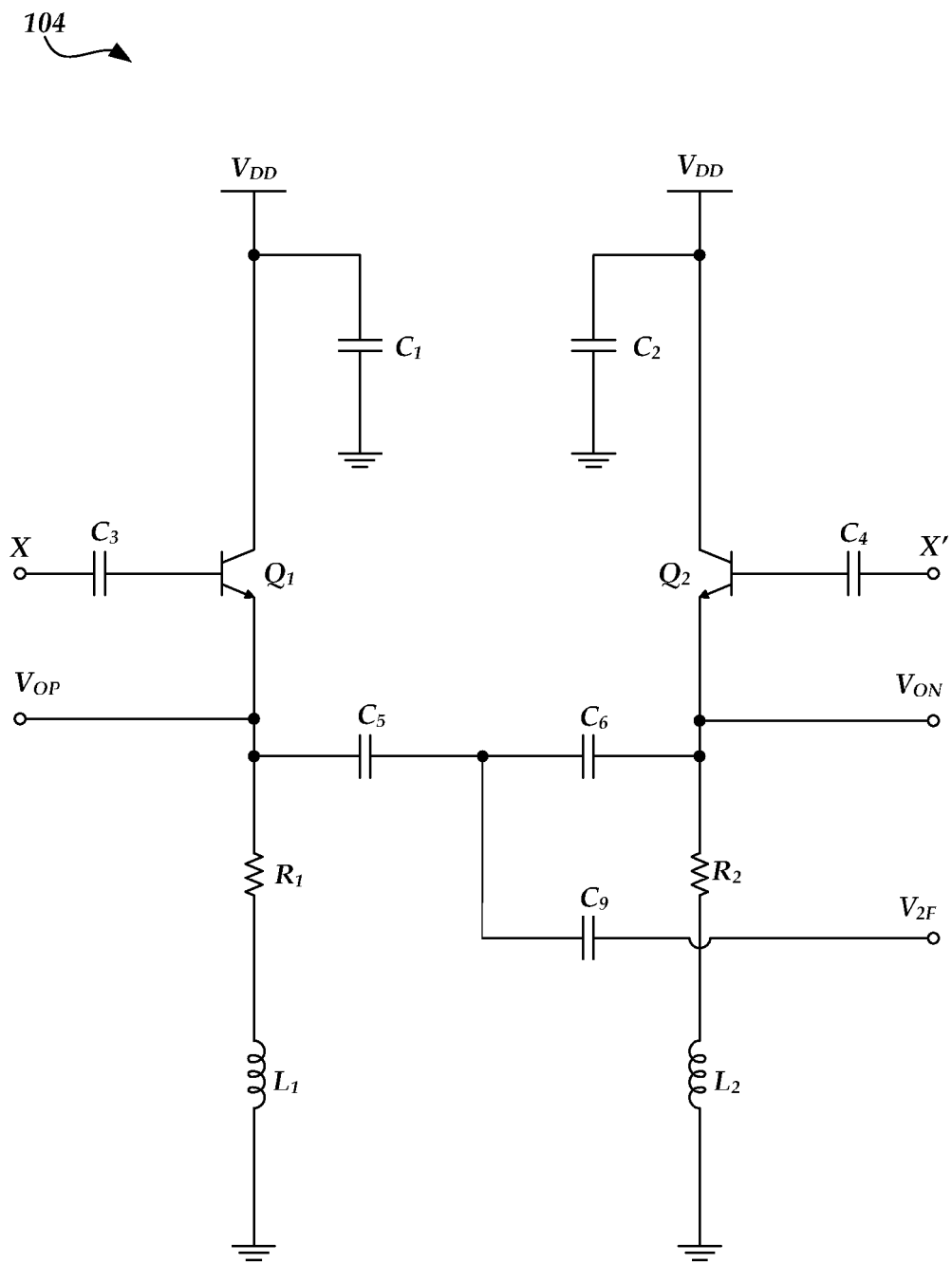
FIGS. 2a and 2b illustrate various embodiments of the oscillator core of FIGS. 1a and 1b.

FIG. 2a illustrates an embodiment of the oscillator core 104 of FIGS. 1a and 1b. The oscillator core 104 as shown in FIG. 2a is implemented as a push-push oscillator core and includes NPN BJT transistors $Q_1, Q_2$; capacitors $C_1, \ldots, C_6$, $C_9$; resistors $R_1, R_2$; and inductors $L_1, L_2$. As shown in FIG. 2a, transistors Q1 and Q2 are each in common collector configuration. In the illustrated embodiment, the two transistors $Q_1, Q_2$ can each correspond to the transistor 110 (FIGS. 1a and 1b).

A push-push oscillator represents a balanced circuit of two coupled oscillators. The first oscillator ("$Q_1$ Oscillator") comprises transistor $Q_1$ in common collector configuration with resistor $R_1$; capacitors $C_1, C_3$; and inductor $L_1$. The second oscillator ("$Q_2$ Oscillator") comprises transistor $Q_2$ in common collector configuration with resistor $R_2$; capacitors $C_2, C_4$; and inductor $L_2$. The $Q_1$ Oscillator and $Q_1$ Oscillator are coupled reactively by the two capacitors $C_5, C_6$, as described below. The two transistors $Q_1, Q_2$ generate the differential signals $V_{OP}, V_{ON}$, respectively. In operation, the differential signals $V_{OP}, V_{ON}$ have anti-phase oscillations at the fundamental frequency and odd harmonics and in-phase oscillations at even harmonics. As a result, converting the differential signals $V_{OP}, V_{ON}$ to a single-ended signal—say, $V_O$—can suppress the even harmonics of the $Q_1$ Oscillator and $Q_1$ Oscillator. A push-push oscillator can achieve up to a 9 dB improvement in phase noise over conventional oscillators.

Accordingly, the oscillating signal $V_O$ of the oscillator core 104 shown in FIGS. 1a and 1b can be the single ended output of the differential signals $V_{OP}, V_{ON}$, wherein the non-inverted signal $V_{OP}$ is provided by the node at the emitter of the transistor $Q_1$ and the inverted signal $V_{ON}$ is provided by the node at the emitter of the transistor $Q_2$.

As part of a grounding network, the capacitor $C_1$ can be connected between the collector of the transistor $Q_1$ and a voltage reference, such as ground. Likewise, the capacitor $C_2$ can be connected between the collector of the transistor $Q_2$ and ground. This grounding network can also be a resonant network that provides a low impedance path to ground at either $V_O$ or $V_{2F}$. In some embodiments, the values of the capacitances of the capacitors $C_1, C_2$ can be approximately 10 picofarads (pF). Other values will be readily determined by one of ordinary skill in the art.

As part of an emitter biasing network, the resistor $R_1$ and the inductor $L_1$ are connected in series between the emitter of the transistor $Q_1$ and ground. Likewise, the resistor $R_2$ and the inductor $L_2$ are connected in series between the emitter of the transistor $Q_2$ and ground. In some embodiments, the resistances of the resistors $R_1, R_2$ are each approximately 50 ohms ($\Omega$), and the inductances of the inductances $L_1, L_2$ are each approximately 2 nanohenries (nH). Other values will be readily determined by one of ordinary skill in the art.

The capacitor $C_3$ is connected between the base of the transistor $Q_1$ and the node X. Likewise, the capacitor $C_4$ is connected between the base of the transistor $Q_1$ and the node X'. In some embodiments, the capacitances of the capacitors $C_3, C_4$ are each approximately 1-10 pF.

As stated, the $Q_1$ Oscillator and $Q_2$ Oscillator are coupled reactively by the two capacitors $C_5, C_6$. The capacitors $C_5, C_6$ are connected in series between the emitter of the transistor $Q_1$ and the emitter of the transistor $Q_2$. The capacitor $C_9$ is connected to the node between the capacitors $C_5, C_6$ and to the $V_{2F}$ output node. Due to the symmetry of the oscillator core 104, this node between capacitors C5, C6 can be a virtual ground at which the fundamental harmonics of the $Q_1$ Oscillator and the $Q_2$ Oscillator are in anti-phase. As a result, the fundamental harmonic can be suppressed at that node and the second harmonic can be extracted at the $V_{2F}$ output node. In some embodiments, the capacitances of the capacitors $C_5, C_6$ are each approximately 1-10 pF. In some embodiments, the capacitance of the capacitor $C_9$ is approximately 1-10 pF.

A supply voltage $V_{DD}$ is connected to the collectors of the transistors $Q_1$ and $Q_2$. In some embodiments, the supply voltage $V_{DD}$ is approximately 1.8-8 V. Other values will be readily determined by one of ordinary skill in the art.

As stated above, the oscillator core 104 shown in FIG. 2a has a push-push topology. Those skilled in the art will appreciate from the disclosure herein that in another embodiment can have a different oscillator topology, including a cross-connected oscillator topology.

Figure 2B:
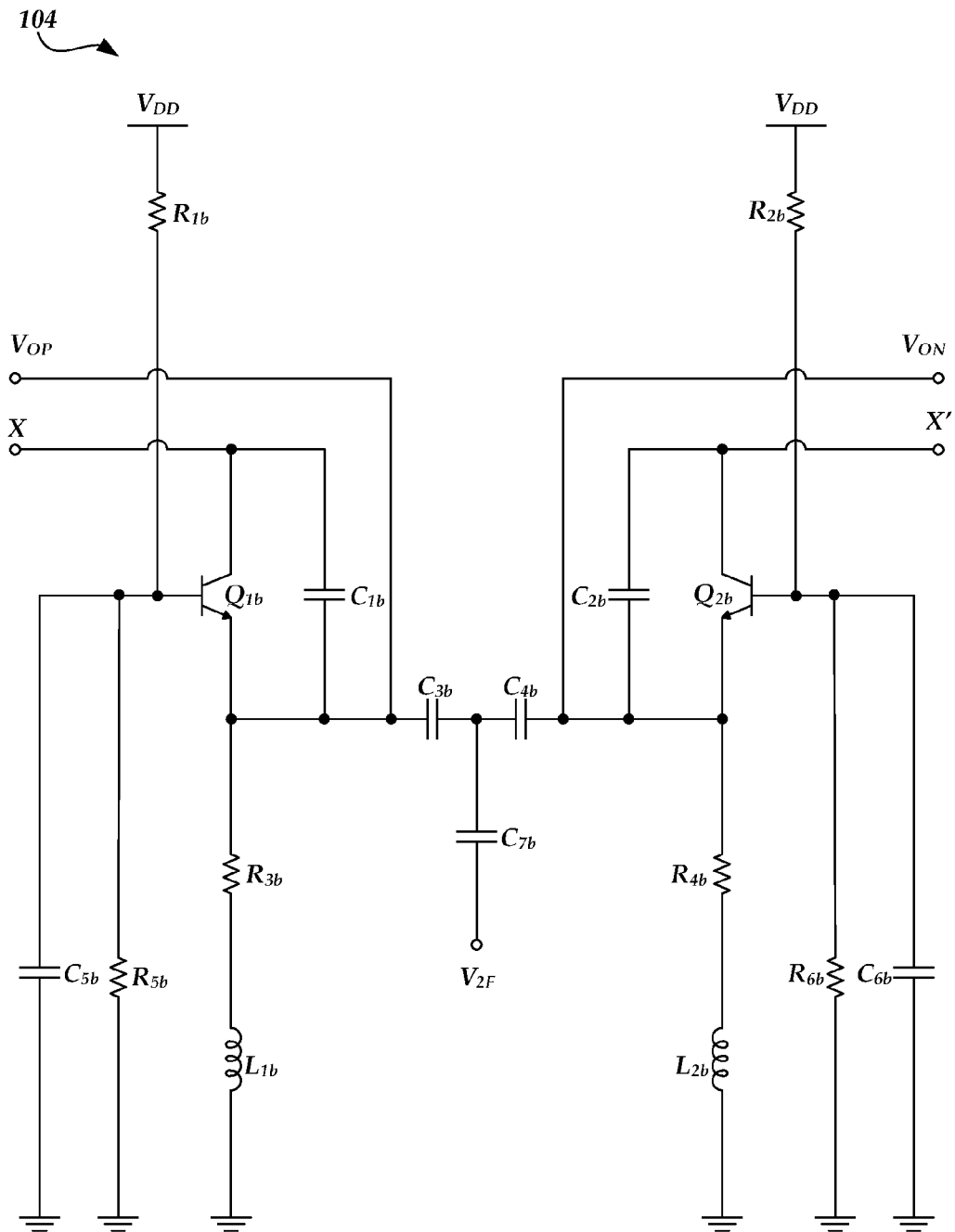

The oscillator core 104 as shown in FIG. 2a is in a common collector configuration. Other configurations such as common base and common emitter will be readily determined by one of ordinary skill in the art. For example, FIG. 2b is a circuit diagram illustrating oscillator core 104 in accordance with another embodiment that utilizes a common base configuration. Elements common to both FIG. 2a and FIG. 2b share common reference indicia, and only differences between FIG. 2a and FIG. 2b are described herein for the sake of brevity. The oscillator core 104 shown FIG. 2b includes two NPN BJT transistors $Q_{1b}, Q_{2b}$; resistors $R_{1b}, \ldots, R_{6b}$; capacitors $C_{1b}, \ldots, C_{7b}$; and inductors $L_{1b}, L_{2b}$. Values of these components will be readily determined by one of ordinary skill in the art.

As shown in FIG. 2b, transistor $Q_{1b}$ is in a common base configuration with resistors $R_{1b}, R_{3b}$, and $R_{5b}$; capacitors $C_{1b}$ and $C_{5b}$; and inductor $L_{1b}$. This portion of the oscillator core 104 forms a first oscillator. Resistor $R_{1b}$ has a first end connected with a supply voltage $V_{DD}$ and a second end connected with the base terminal of the transistor $Q_{1b}$. Resistor $R_{5b}$ and capacitor $C_{5b}$ are connected in parallel between the base of the transistor $Q_{1b}$ and ground. Resistor $R_{3b}$ and inductor $L_{1b}$ are connected in series between the emitter of transistor $Q_{1b}$ and ground. Capacitor $C_{1b}$ has a first end and a second end that are connected with the collector and emitter of transistor $Q_{1b}$, respectively. The collector of $Q_{1b}$ is also connected with node X. The emitter of $Q_{1b}$ provides the non-inverted signal $V_{OP}$.

Transistor $Q_{2b}$ is similarly in a common base configuration, with resistors $R_{2b}, R_{4b}$, and $R_{6b}$; capacitors $C_{2b}$ and $C_{6b}$; and inductor $L_{1b}$. This portion of the circuit forms a second oscillator. Resistor $R_{2b}$ has a first end connected with a supply voltage $V_{DD}$ and a second end connected with the base terminal of the transistor $Q_{2b}$. Resistor $R_{6b}$ and capacitor $C_{6b}$ are connected in parallel between the base of the transistor $Q_{2b}$ and ground. Resistor $R_{4b}$ and inductor $L_{2b}$ are connected in series between the emitter of transistor $Q_{2b}$ and ground. Capacitor $C_{2b}$ has a first end and a second end that are connected with the collector and emitter of transistor $Q_{2b}$, respectively. The collector of $Q_{2b}$ is also connected with node X'. The emitter of $Q_{2b}$ provides the inverted output signal $V_{ON}$.

The transistors $Q_{1b}$ and $Q_{2b}$, and in turn the first and second oscillators, are electrically and/or reactively coupled. As shown in FIG. 2b, capacitors $C_{3b}$ and $C_{4b}$ are connected in series between the emitters of transistors $Q_{1b}$ and $Q_{2b}$. Additionally, capacitor $C_{7b}$ has a first end connected with the node between capacitors $C_{3b}$ and $C_{4b}$ and a second end that provides the second output signal $V_{2F}$. For the same reasons as discussed in connection with the oscillator core 104 of FIG. 2a, the output signal $V_{2F}$ is primarily the second harmonic signal of the first and second oscillators. The output signal $V_{2F}$ is therefore substantially twice the frequency of $V_O$, which is primarily the fundamental harmonic.

Figure 3:
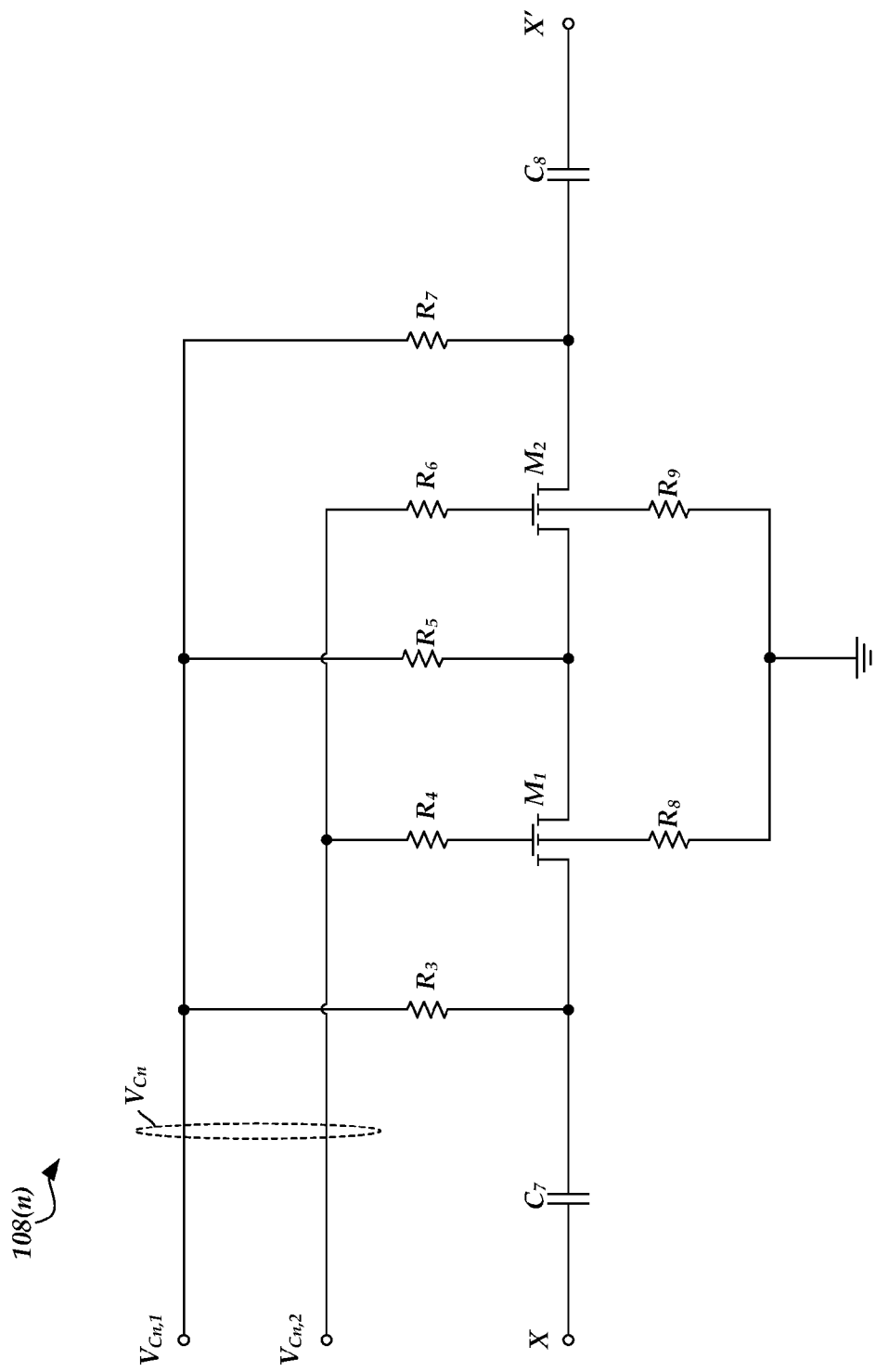
FIG. 3 illustrates an embodiment of one of the tunable units of FIGS. 1a and 1b.

FIG. 3 illustrates an embodiment of the tuning unit 108(n) of FIGS. 1a and 1b. The tuning unit 108(n) includes field effect transistors (FETs) $M_1$, $M_2$; resistors $R_3$, ..., $R_9$; and capacitors $C_7$ and $C_8$. The FETs $M_1$ and $M_2$ are configured as switches in a stacked configuration. In this embodiment, each of the FETs $M_1$, $M_2$ can correspond to the electrical device 112(n) of the oscillator core 104 shown in FIGS. 1a and 1b. The control signals $V_{Cn,1}$, $V_{Cn,2}$ are complementary control signals that can switch the FETs $M_1$, $M_2$ on or off to realize discrete frequency tuning. These controls are generated from a control unit, as discussed in connection with the illustrative example of FIGS. 4, 5, and 8. When the FETs $M_1$, $M_2$ are on, the capacitors $C_7$, $C_8$ are operatively coupled to the oscillator core 104, thereby increasing the capacitance of the LC tank coupled across nodes X and X'. When the FETs $M_1$, $M_2$ are off, the capacitors $C_7$, $C_8$ are not operatively coupled to the oscillator core 104 and do not contribute capacitance to the resonator tank. According, the switching of the capacitors $C_7$, $C_8$ provides band switching capabilities. In some embodiments, the capacitances of the capacitors $C_7$, $C_8$ are each approximately 25 to 1000 femtofarads (fF), and the sizes of the FETs $M_1$, $M_2$ are each 50 to 1000 square micrometers ($\mu m^2$) with widths of 5-50 $\mu m$. Other values will be readily determined by one of ordinary skill in the art.

In some embodiments, an advantage of the tuning unit 108(n) over previous existing tuning units of oscillators is that the tuning unit 108(n) can have high-voltage and high-frequency capabilities. One problem associated with high-voltage and high-frequency oscillators is that the voltage across X and X' may exceed the breakdown voltage of one transistor. Thus, switches or tuning units having only one transistor as a switch may not be practical. However, using more than one transistor in a switch or tuning unit may increase the amount of RF interference on the control signal lines $V_{Cn}$, where the source of the RF interference is the high-frequency voltage oscillations across nodes X and X'. The increase in RF interference on the control lines is caused by the additional parasitic capacitance the control line $V_{Cn}$ sees due to additional transistors. For example, with reference to FIG. 3, the two FETs $M_1$ and $M_2$ have parasitic capacitances $C_{GS1}$, $C_{GD1}$, $C_{GS2}$, and $C_{GD2}$ (all parasitic capacitances not shown) that couple the X or X' nodes with the control line $V_{CN,2}$. Furthermore, using more than one transistor may increase the overall parasitic on-resistance $r_0$ (not shown) when the transistor are on, resulting in increased power loss.

Despite these obstacles, the tuning unit 108(n) can provide switching and/or tuning capabilities for high-voltage and high-frequency oscillators. For these applications, it can be advantageous to arrange the FETs $M_1$, $M_1$ by stacking them as shown in FIG. 3 so that the voltage across X and X' is spread across the two FETs $M_1$, $M_1$. For example, consider that the case where the FETs $M_1$, $M_1$ individually have breakdown voltages of approximately 1.8 to 3 V. The FETs $M_1$, $M_2$ arranged as shown in FIG. 3 can thereby operate with resonator or tank voltages substantially greater than 3V.

Additionally, various features of the tuning unit 108(n), individually or in combination, can mitigate some of the above-stated disadvantages of using multiple transistors for tuning high-voltage and high-frequency oscillators. The resistors $R_3$, ..., $R_7$ can act as RF blocks that can attenuate the parasitic leakage of RF signals (due to the high frequency operation of the oscillator core 104) of nodes X and X' to the control lines that carry the control signal $V_{Cn}$. These resistors $R_3$, ..., $R_7$ can additionally or alternatively act as DC-bias feeds to the gates of the FETs $M_1$, $M_2$. In some embodiments, the resistances of $R_3$, ..., $R_7$ are each approximately 5 to 50 k$\Omega$. Other values will be readily determined by one of ordinary skill in the art.

Further, in some embodiments, the resistor $R_8$ is connected between the body of the FET $M_1$ and ground. Similarly, the resistor $R_9$ is connected between the body of the FET $M_2$ and ground. This network can be implemented on an SOI process with deep trench isolation that allows the resistors $R_8$, $R_9$ to be tied to ground in a practical manner. As so configured, the network can block RF signals because $R_8$, $R_9$ behave as high impedances to RF signals. Further, this network can also reduce power losses associated with transistor stacking by reducing the capacitances the FETs $M_1$, $M_1$ see looking to ground. Further yet, the network can improve the linearity of the switch. In some embodiments, the resistances of the resistors $R_8$, $R_9$ are each approximately 5 to 50 k$\Omega$. Other values will be readily determined by one of ordinary skill in the art.

Figure 4:
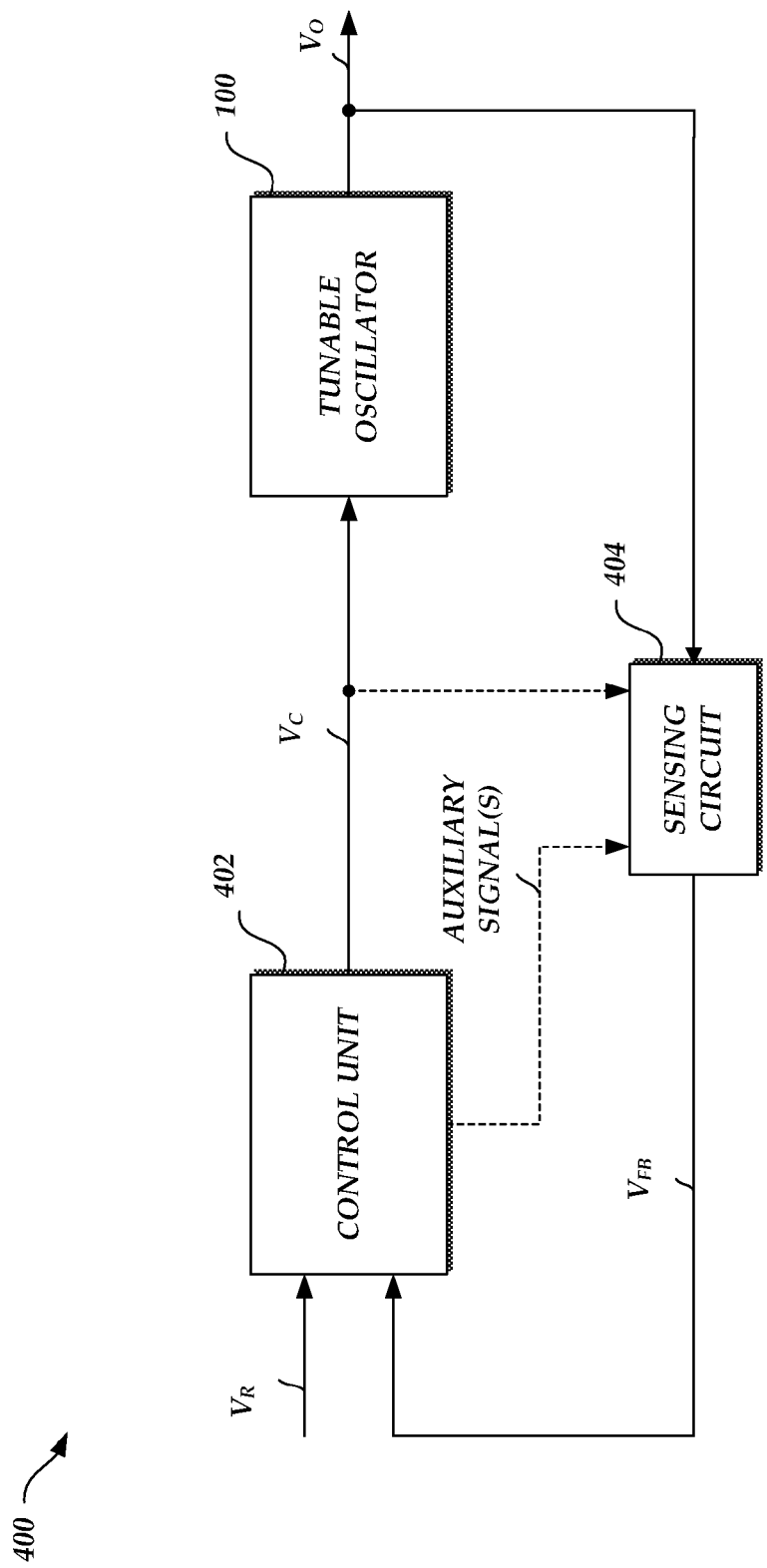
FIG. 4 depicts a block diagram of an illustrative PLL circuit including the monolithic tunable oscillator of FIGS. 1a and 1b, as well as a control unit and a sensing circuit.

FIG. 4 depicts a block diagram of an exemplary PLL circuit 400 including the monolithic tunable oscillator 100 of FIGS. 1a and 1b, as well as a control unit 402 and an optional sensing circuit 404. The PLL circuit 400 receives a reference signal $V_R$ as an input and generates the oscillating signal $V_O$ such that the oscillating signal $V_O$ tracks the (optionally divided) frequency and phase of the reference signal $V_R$. The control unit 402 receives as inputs the reference signal $V_R$ and the feedback signal $V_{FB}$, which is generated by the sensing circuit 404. As explained below in connection with FIG. 5, the feedback signal $V_{FB}$ is a processed version of the oscillating signal $V_O$. As shown, the control unit 402 provides the control signal $V_C$ to the tuning units 108(1), ..., 108(n) for control of the phase and/or frequency of the oscillating signal $V_O$. As stated, in some embodiments, the control signal $V_C$ comprises the signals $V_{C1}$, ..., $V_{Cn}$ as shown, for example, in FIG. 1a. In some embodiments, $V_C$ comprises $V_{C1}$, ..., $V_{Cn}$, $V_{C(n+1)}$ as shown in FIG. 1b. In some embodiments, the sensing circuit receives auxiliary signal(s) and the control signal $V_C$. Generally, the auxiliary signal(s) can be any internal or external signal(s) of the control unit 402 that the sensing circuit 404 may use.

Figure 5:
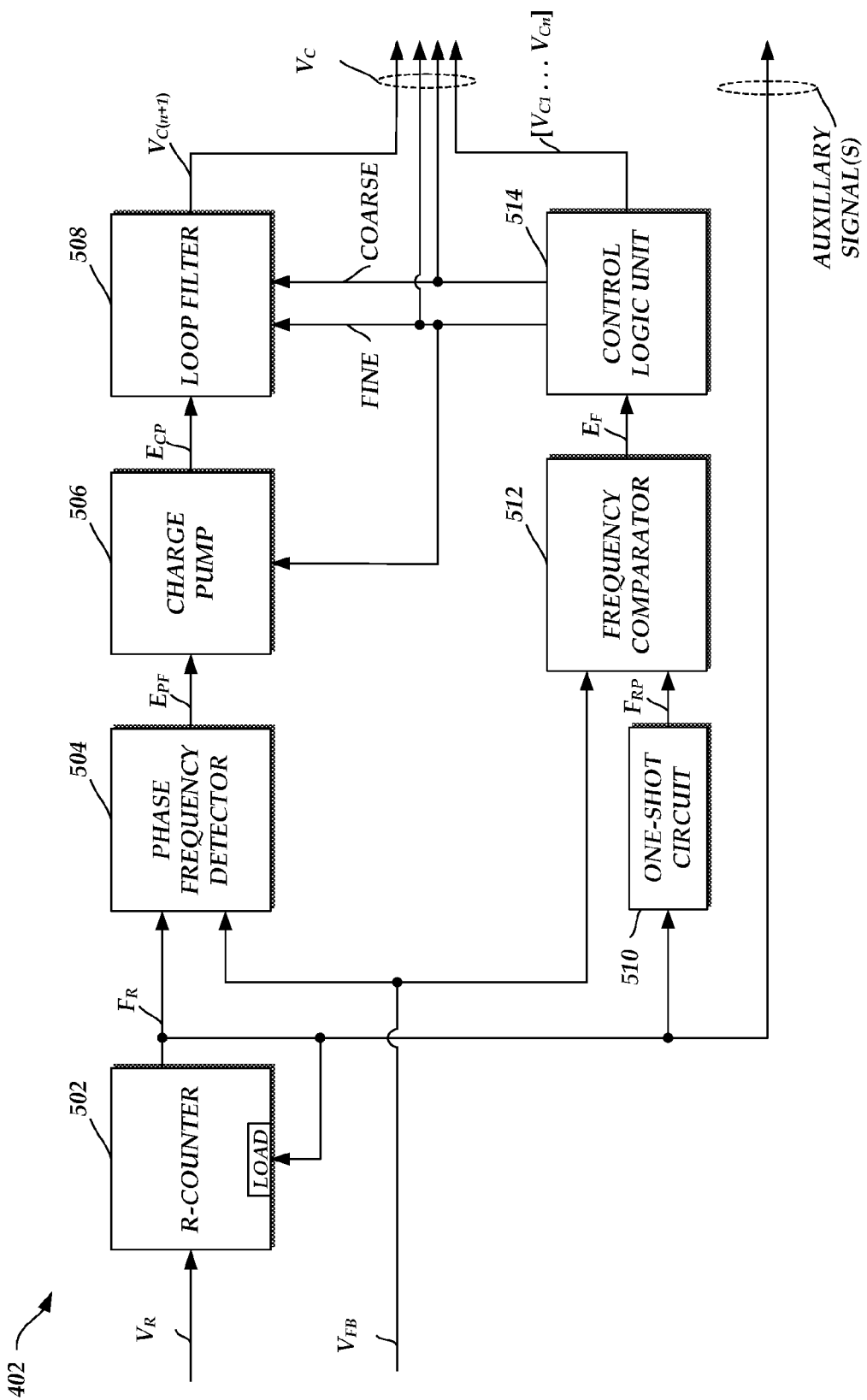
FIG. 5 depicts a block diagram of the control unit of FIG. 4 according to an embodiment.

FIG. 5 illustrates further details of the control unit 402 of FIG. 4 according to an embodiment. The control unit 402 includes an R-counter 502, phase-frequency detector 504, charge pump 506, loop filter 508, one-shot circuit 510, frequency comparator 512, and control logic unit 514. The control unit 402 receives the reference signal $V_R$ and the feedback signal $V_{FB}$ as inputs, and generates the control signal $V_C$ and auxiliary signals as outputs. In some embodiments, the control signal $V_C$ controls fine and/or coarse adjustment of the frequency of the oscillating signal $V_O$. For example, the control signals $V_{C1}$, ..., $V_{Cn}$ associated with the tuning units 108(1), ..., 108(n) can control coarse adjustments, and the control signal $V_{C(n+1)}$ associated with the varactor 114 can control fine adjustments. As shown in FIG. 4, the control signals $V_{C1}, \ldots, V_{Cn}$ can be generated by the lower path comprising the one-shot circuit 510, frequency comparator 512, and control logic unit 514. This path also provides the logical control signals "FINE" and "COARSE," which are used to signal either fine or coarse adjustment mode. The control signal $V_{C(n+1)}$ is generated by the upper path comprising the phase frequency detector 504, charge pump 506, and loop filter 508.

Because it can be difficult to produce a reliable reference signal having many practical target frequency ranges, a stable, highly-reliable oscillator (not shown) can be used to generate the reference signal $V_R$ at a frequency higher than the target frequency, and a frequency divider can be used to generate an internal reference signal having the target frequency. For example, in the embodiment illustrated in FIG. 5, the R-counter 502 performs frequency division. In one embodiment, the R-counter 502 can be a down counter initialized with R cycles. Alternatively, an up counter can be used. The R-counter 502 receives the high frequency reference signal $V_R$ as an input and generates a reduced frequency signal $F_R$ as an output. In one embodiment, the R-counter 502 operates as follows. The reference signal $V_R$ accordingly decrements the R-counter 502 for every cycle of the reference signal $V_R$. The reduced frequency signal $F_R$ output of the R-counter 502 remains set as logic high as the R-counter 502 is counting down. When the R-counter 502 times out after R cycles of the reference signal $V_R$, the R-counter 502 sets the reduced frequency signal $F_R$ to logic low. Because the reduced frequency signal $F_R$ is fed back to the "load" port of the R-counter 502, timing out causes the R-counter 502 to reset its count to R cycles on the next cycle.

To generate the control signal $V_{C(n+1)}$ for fine tuning, the phase frequency detector 504 receives the reduced frequency signal $F_R$ and the feedback signal $V_{FB}$ as inputs and provides the charge pump 506 an error signal $E_{PF}$ that represents a measure of the phase error and/or frequency error between the reduced frequency signal $F_R$ and the feedback signal $V_{FB}$. The charge pump 506 receives the error signal $E_{PF}$ as an input and provides the loop filter 508 with a charge pump error signal $E_{CP}$. If the fine control signal is set logic high, the loop filter 508, being an analog or digital filter, processes the charge pump error signal $E_{CP}$ and generates the control signal $V_{C(n+1)}$. In some embodiments, the loop filter 508 has a gain and a bandwidth selected to meet stability and bandwidth requirements. As stated above, in some embodiments the control signal $V_{C(n+1)}$ adjusts the capacitance of the varactor 114 to provide fine tuning adjustments of the frequency of the oscillating signal $V_O$. If the control signal FINE is set logic low, the loop filter 508 generates a constant control signal $V_{C(n+1)}$ during coarse tuning. For example, in some embodiments a logic low FINE and a logic high COARSE cause the loop filter 508 to switch its output $V_{C(n+1)}$ to a constant power supply (not shown), thereby producing a constant control signal $V_{C(n+1)}$.

To generate the control signals $V_{C1}, \ldots, V_{Cn}$ for coarse tuning, the one-shot circuit 510 receives the reduced frequency signal $F_R$ as an input and provides the frequency comparator 512 a pulse $F_{RP}$. The frequency comparator 512 provides the control logic unit 514 with a frequency error signal $E_F$ that indicates an approximate measure of the mismatch between frequencies of the reduced frequency signal $F_R$ and the feedback signal $V_{FB}$. The control logic unit 514 receives $E_F$ as input and provides the control signals FINE and COARSE, as well as the control signals $V_{C1}, \ldots, V_{Cn}$. As stated, in some embodiments the control signals $V_{C1}, \ldots, V_{Cn}$ switch the n tuning units 108(1), ..., 108(n) on or off to provide coarse tuning and/or band switching. The control logic unit 514 may include a successive approximation register (SAR) (not shown) for performing a binary search through the possible quantization levels of the tuning unit control signals $V_{C1}, \ldots, V_{Cn}$. An exemplary method for generating the control signals FINE, COARSE, and $V_{C1}, \ldots, V_{Cn}, V_{C(n+1)}$ is discussed further in connection with FIGS. 7 and 8.

Figure 6:
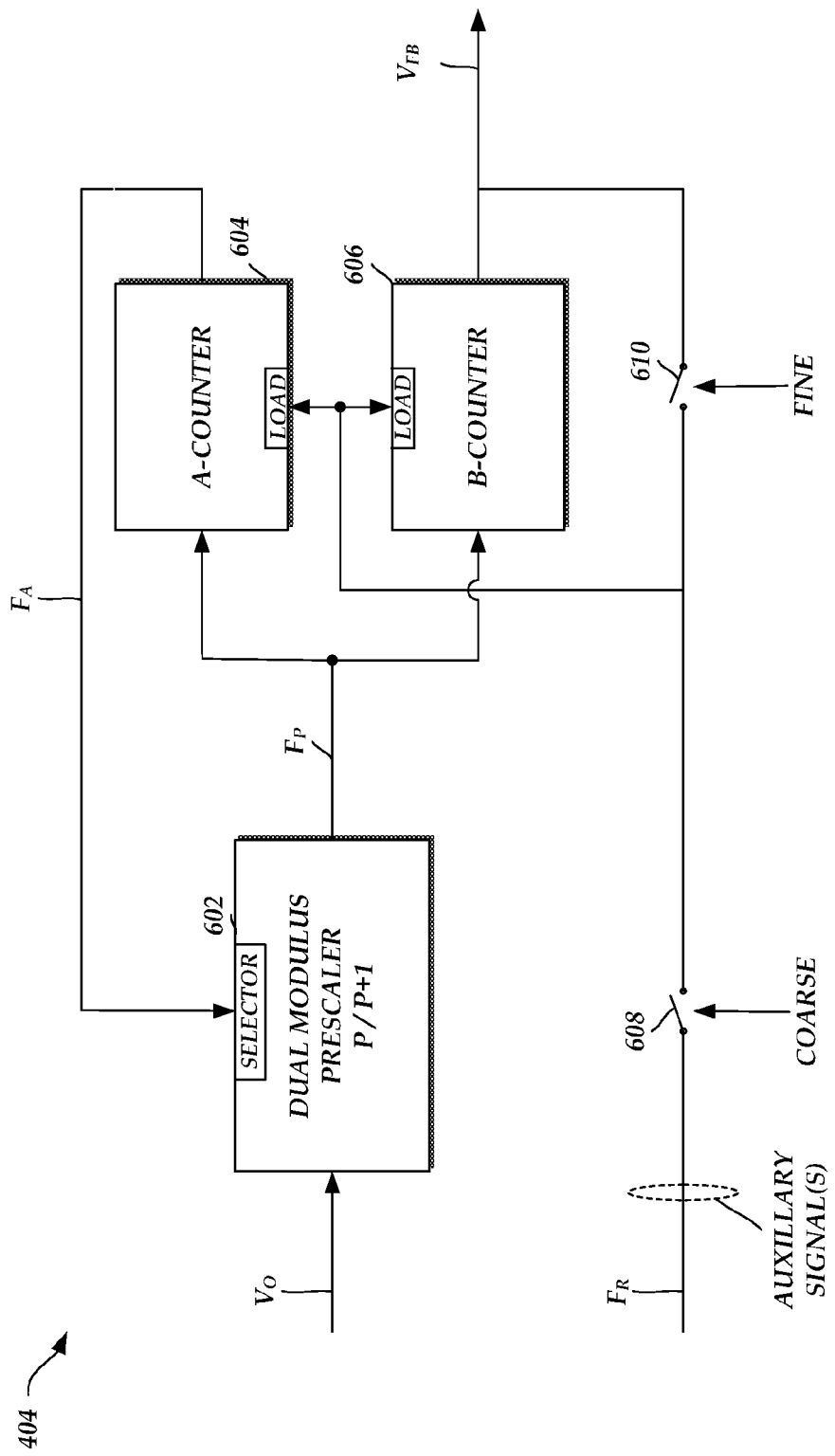
FIG. 6 shows a block diagram of the sensing unit of FIG. 4 according to an embodiment.

FIG. 6 shows a block diagram of the optional sensing circuit 404 of FIG. 4 according to an embodiment. The sensing circuit 404 includes a dual modulus prescaler 602, A-counter 604, B-counter 606, and switches 608, 610. The sensing circuit can be a digital and/or analog circuitry configured to frequency divide the oscillating signal $V_O$. A dual modulus prescaler scheme comprising the dual modulus prescaler 602, A-counter 604, and B-counter 606 as shown in FIG. 6 may improve output resolution for high frequency signals.

In operation, the oscillating signal $V_O$ triggers the dual modulus prescaler 602, which counts down from either P+1 or P according to the output $F_A$ of the A-counter 604. When the A-counter 604 is counting, its output $F_A$ is set logic high and causes the dual modulus prescaler 602 count down from an initial count of P+1. When the A-counter 604 times out, its output $F_A$ is set logic low and causes dual modulus prescaler 602 to count down from P. The A-counter 604 and B-counter 606 are down counters that are decremented by the output $F_P$ of the dual modulus prescaler 602. An initial count B of the B-counter 606 is greater than or equal to an initial count A of the A-counter 604 (for example, B≥A). Accordingly, after the A-counter 604 times out and causes the dual modulus prescaler 602 timer to be set at P, the B-counter 606 is decremented every P cycles of the oscillating signal $V_O$. As a result, the B-counter 606 times out after A+PB cycles of the oscillating signal $V_O$.

The load inputs of the A-counter 604 and the B-counter 606 cause the timer of each counter to be reset to an initial state. As shown in FIG. 6, the load input can either be the feedback signal $V_{FB}$ or the reduced frequency signal $F_R$, depending on whether the PLL 400 is in fine adjustment mode or in coarse adjustment mode. In fine adjustment mode, the switch 608 is open and the switch 610 is closed, so that the feedback signal $V_{FB}$ is provided to the A-counter 604 and the B-Counter 606 as the load inputs. Accordingly, when the B-counter 606 times out after A+PB cycles, the A-counter 604 and the B-counter 606 reset their timers to A and B, respectively. In coarse adjustment mode, the switch 608 is closed and the switch 610 is opened, so that the reduced frequency signal $F_R$ is provided to the A-counter 604 and the B-counter 606 as the load inputs. Accordingly, the A-counter 604 and B-counter 606 reset every R cycles of the reference signal $V_R$.

Figure 7A:
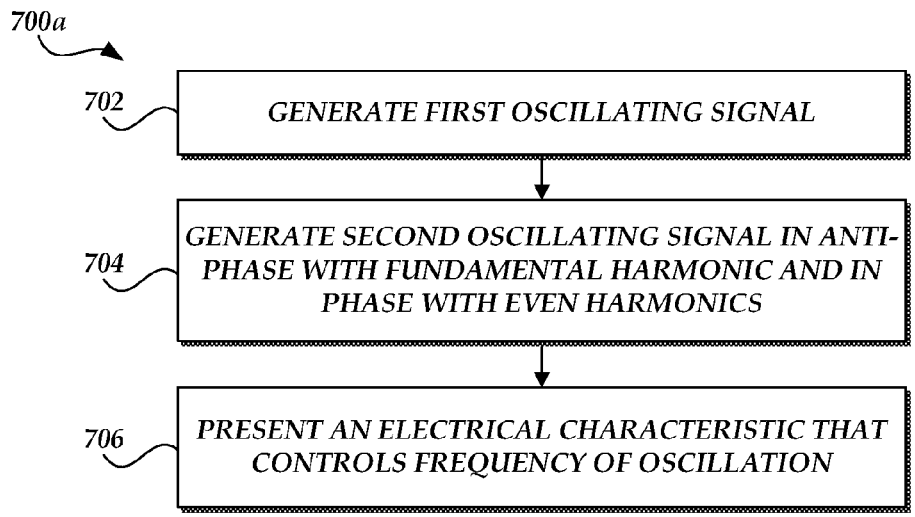
FIG. 7a is an illustrative flow diagram of an example method for generating an oscillating signal.

FIG. 7a is an illustrative flow diagram of a method 700a for controlling oscillating electrical signals. At a block 702, a first oscillating signal is generated. In some embodiments a first circuit can be used to generate the first oscillating signal. The first circuit can have a transistor. The $Q_1$ Oscillator of the oscillator core 104 of FIG. 2a can, for example, be used to generate the first oscillating signal $V_{OP}$. The method advances from the block 702 to a block 704.

At the block 704, a second oscillating signal is generated, where the second oscillating signal is in anti-phase with the first oscillating signal at the fundamental and odd harmonics and in phase with the first oscillating signal at even harmonics. In some embodiments a second circuit can be used to generate the second oscillating signal. The first circuit and second circuit can be coupled with each other. With reference to FIG. 2a, the $Q_2$ Oscillator, being coupled with the $Q_1$ Oscillator, can for example be used to generate the second oscillating signal $V_{ON}$. As stated above in connection with FIG. 2a, the oscillating signals $V_{OP}$ and $V_{ON}$ are in anti-phase at the fundamental and odd harmonics and in phase at even harmonics. The method advances from the block 704 to a block 706.

At block 706, an electrical characteristic is presented to the first circuit and second circuit. The electrical characteristic can control a frequency of oscillation of the first oscillating signal and/or the second oscillating circuit. In some embodiments, a third circuit can be used to present the electrical characteristic to both the first circuit and the second circuit. The third circuit can have an electrical device having a structural type different from the structural type of transistor. A tuning unit 108(n) can, for example, be used to present the electrical characteristic to the oscillator core 104, and in turn to the $Q_1$ Oscillator and the $Q_2$ Oscillator. As stated, each of the tuning units 108(1), ..., 108(n) can control the frequency of oscillation of the oscillating signal $V_O$ by controlling the frequency of oscillation of the oscillating signals $V_{OP}$ and $V_{ON}$.

In some embodiments, a third circuit can be used to present the electrical characteristic to at least one of the first circuit or the second circuit, as discussed in connection with FIG. 1a. For example, a tuning unit 108(n) can include a first single-ended circuit and a second single-ended circuit, where the first single-ended circuit is coupled with the first circuit (for example, the first oscillator) and the second single-ended circuit is coupled with the second oscillator (for example, the second oscillator) of the oscillator core 104. The first single-ended circuit and the second single-ended circuit can present electrical characteristics independently to the corresponding first circuit or second circuit.

Figure 7B:
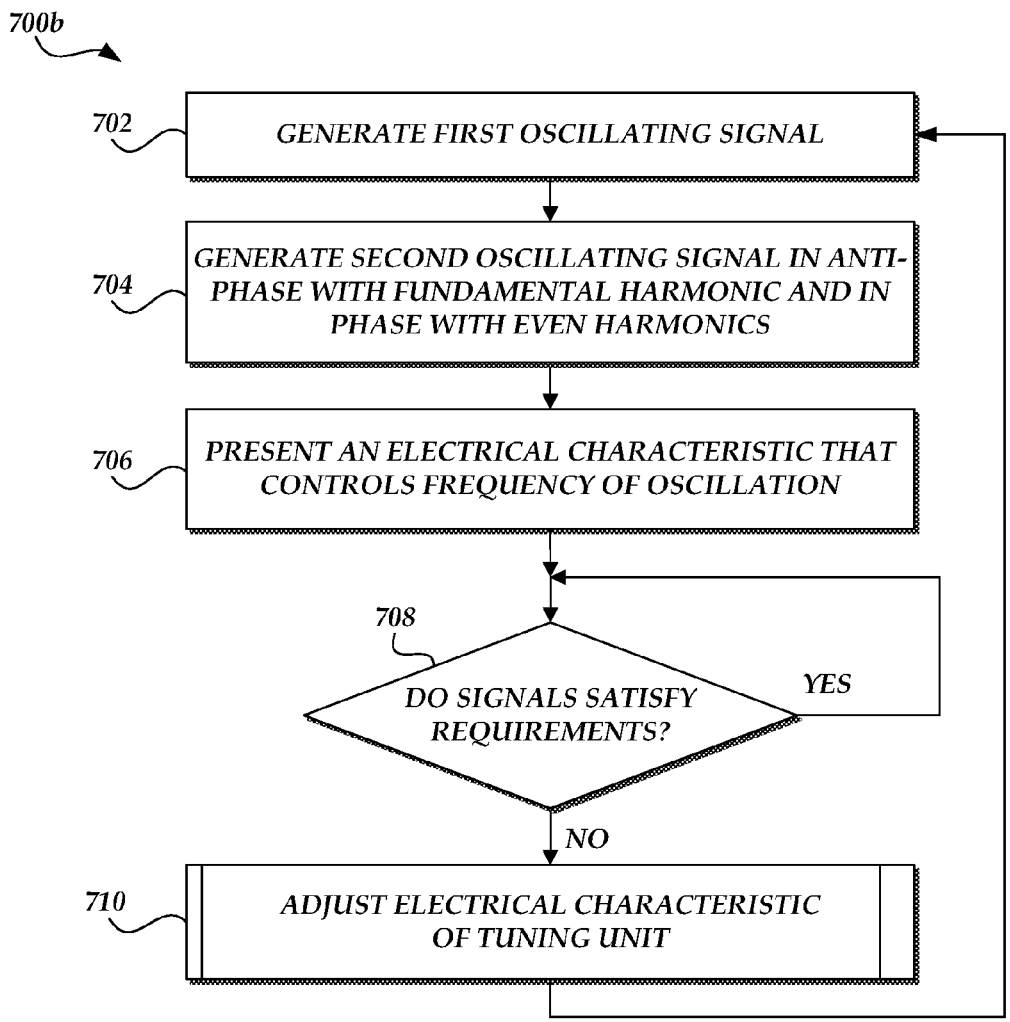
FIG. 7b is an illustrative flow diagram of an example method for generating an oscillating signal in accordance with certain requirements.

FIG. 7b is an illustrative flow diagram of a method 700b for generating an oscillating signal in accordance with certain requirements. Examples of requirements include meeting the target frequency, phase, and amplitude within tolerances; and maintaining control signals $V_C$ and/or electrical characteristics within design limits. The method 700b illustrated in FIG. 7b is similar to and adapted from the method 700a illustrated in FIG. 7a. Elements common to both methods 700a, 700b share common reference indicia, and only differences between the methods 700a, 700b are described herein for the sake of brevity. The blocks 702, 704, 706 can be as described earlier in connection with FIG. 7a. The method advances from the block 706 to a decision block 708.

As represented by the decision block 708, the method 700b includes testing or checking whether the oscillating signal satisfies the requirements. If the requirements are satisfied, then the method 700b can return to the start of the decision block 708 to repeat testing of whether the requirements are satisfied at some later time. The requirements can be tested periodically and/or when triggered by an event or condition. The testing of the decision block 708 may be performed by, for example, the control logic unit 514 of FIG. 5. In some embodiments, the control logic unit 514 may receive the oscillating signal $V_O$ (which can be generated by converting $V_{OP}$ and $V_{ON}$ to a single-ended output), the control signal $V_{C(n+1)}$, and/or data from a separate module in addition to receiving the frequency error signal $E_F$, the data comprising data related to the requirements. When the requirements are not satisfied, the method proceeds from the decision block 708 to a block 710. As represented by the block 710, the method 700b includes adjusting the electrical characteristics. The control logic unit 514 and the loop filter 508 of the PLL 400 can, for example, generate control signals $V_{C1}, ..., V_{Cn}$, $V_{C(n+1)}$ so that transistors 112(1), ..., 112(n) adjust the electrical characteristics of the n tuning units 108(1), ..., 108(n) and/or the varactor 114. The method can then return from the block 710 to the block 702.

Generally described, in one embodiment, the tuning units 108(1), ..., 108(n) primarily make large or coarse frequency adjustments to bring the frequency of the oscillating signal $V_O$ to within a neighborhood of the target frequency and/or phase. After the oscillating signal $V_O$ is roughly near the target, the varactor 114 is used to align the frequency of oscillating signal $V_O$ more closely with the target frequency and/or phase. One embodiment of a method for implementing the operation of the block 710 is described below in connection with FIG. 8.

Figure 8:
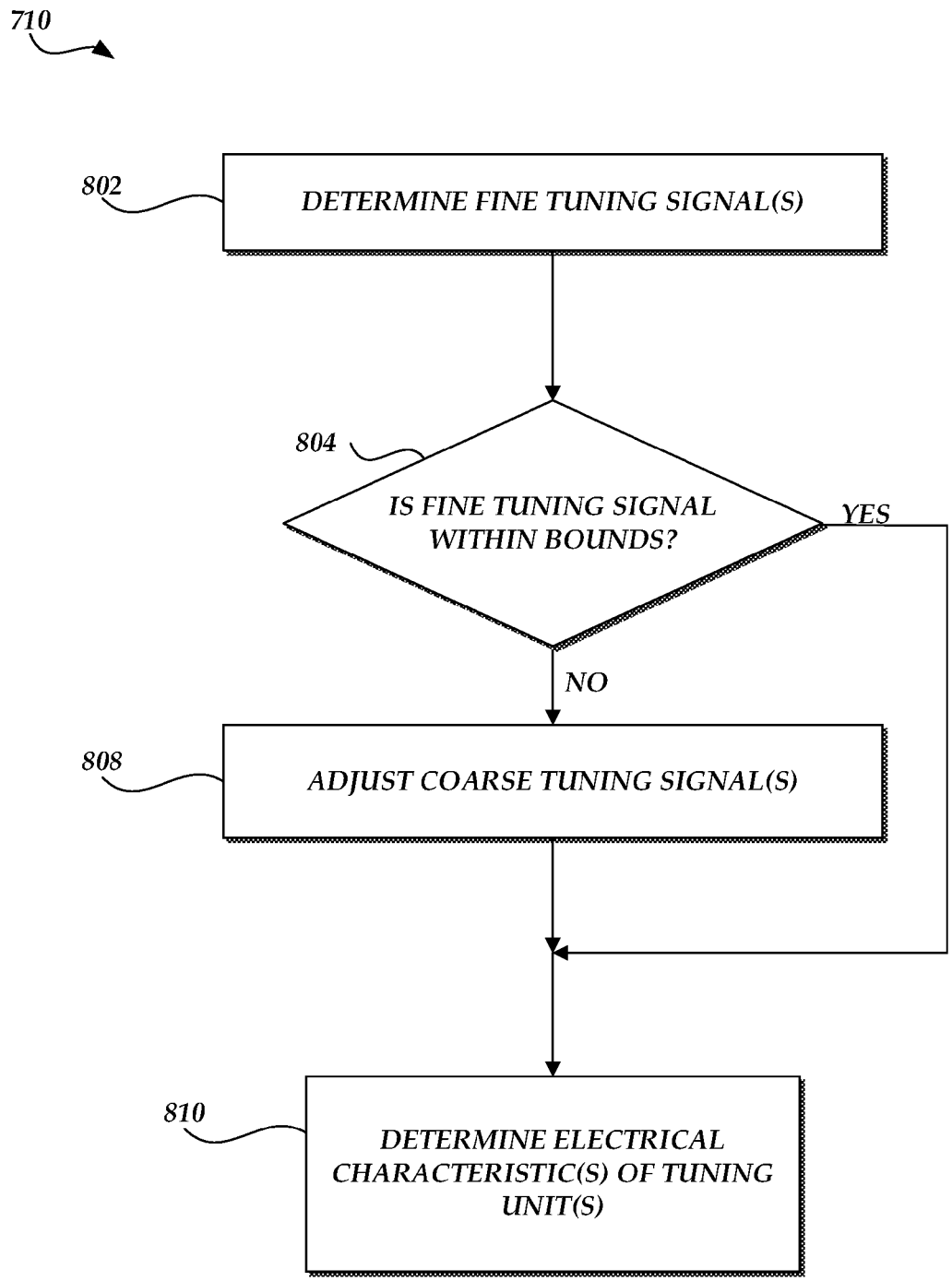
FIG. 8 is an illustrative flow diagram of an example method for coarse and fine tuning the tuning units of FIGS. 2a and 2b according to an embodiment.

FIG. 8 is an illustrative flow diagram of an example method 708 for coarse and fine tuning the tuning units 108(1), ..., 108(n) of FIGS. 1a and 1b according to an embodiment. The method 708 starts at a block 802. As represented by the block 802, the method 708 includes determining the fine tuning signal(s). The loop filter 508, for example, generates the control signal $V_{C(n+1)}$, which controls the variable capacitance of the varactor 114. As stated above, the varactor 114 can be used for fine tuning of the oscillating signal $V_O$. In fine tuning mode, the control signal $V_{C(n+1)}$ can be generated by the loop filter 508 based on the charge-pump error signal $E_{CP}$. In coarse tuning mode, the control signal $V_{C(n+1)}$ can be a predetermined signal such as a DC signal supplied by a power source or a voltage reference. The method 708 advances the block 802 to a decision block 804.

As represented by the decision block 804, the method 708 can include testing or checking whether the fine tuning signal is within a bound. The bound can include an upper bound and/or a lower bound. In some embodiments, the bound can be specified based on considerations with respect to one or more of the following aspects: the limits of the power source, swing voltage of the PLL 400, the breakdown voltage of a component of the PLL 400, and the like. In some embodiments, the control logic unit 514 performs the testing or checking of the decision block 804. The method 708 proceeds from the decision block 804 to a block 808 when the fine tuning signal is not within the bound, and proceeds from the decision block 804 to a block 810 when the fine tuning signal is within the bound. As represented in the block 808, the method 708 includes adjusting the coarse tuning signal(s). In some embodiments, when the fine tuning signal (for example, $V_{C(n+1)}$) exceeds the bounds (for example, $|V_{C(n+1)}|>V_{MAX}$), the control unit 402 goes into the coarse tuning mode. As stated earlier, in the coarse tuning mode the control signal $V_{C(n+1)}$ can be set to a constant value. Additionally and/or alternatively, in some embodiments the control logic unit 514 may, for example, search sequentially for a control signal $V_C$ that yields a frequency of oscillating signal $V_O$ that is roughly near the target frequency. As represented by the block 810, the method 708 includes determining the electrical characteristics of the n tuning units 108(1), ..., 108(n). The electrical characteristics can be based at least partly on the coarse tuning signal.

Numerous inventive principles have been described above, and each has independent utility. In some cases, additional benefits and advantages are realized when the principles are utilized in various combinations with one another. For example, various embodiments of oscillator and PLL arrangements have been described above. Elements of these individual embodiments, however, may be combined with any active circuit. Such an active circuit may be implemented according to the principles and advantages of the embodiments to provide a relatively more robust signal synthesis or synchronization arrangement for the active circuit.

Some of the embodiments disclosed herein have been described with specific signals implemented as current-mode or voltage mode signals, but the inventive principles also contemplate other types of signals, whether characterized as voltages or currents. Likewise, some semiconductor devices are described as being specifically NPN or PNP BJTs, but in many cases different polarities or different device and/or structural types such as J-FETs or CMOS transistors can also be utilized.

Moreover, the foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Moreover, oscillator and PLL circuit arrangements employing the above described configurations can be implemented into various electronic devices or integrated circuits. Examples of the electronic devices can include, but are not limited to, consumer electronic products, parts of the consumer electronic products, electronic test equipments, etc. Examples of the electronic devices can also include memory chips, memory modules, circuits of optical networks or other communication networks, and disk driver circuits. The consumer electronic products can include, but are not limited to, a mobile phone, cellular base stations, a telephone, a television, a computer monitor, a computer, a hand-held computer, a personal digital assistant (PDA), a stereo system, a cassette recorder or player, a DVD player, a CD player, a VCR, an MP3 player, a radio, a camcorder, a camera, a digital camera, a portable memory chip, a copier, a facsimile machine, a scanner, a multi functional peripheral device, a wrist watch, a clock, etc. Further, the electronic device can include unfinished products.

Thus, the embodiments described herein can be modified in arrangement and detail without departing from the scope of the appended claims. So although specific embodiments have been described, other embodiments will be apparent to those of ordinary skill in the art from the disclosure herein. For example, a skilled artisan will recognize from the disclosure herein that various methods of manufacture, design, and materials can be used to make the various components described herein. Additionally, other combinations, omissions, substitutions and modifications will be apparent to the skilled artisan in view of the disclosure herein. It is contemplated that various aspects and features of the invention described can be practiced separately, combined together, or substituted for one another, and that a variety of combination and sub-combinations of the features and aspects can be made and still fall within the scope of the invention. Furthermore, the systems described above need not include all of the modules and functions described in the preferred embodiments. Accordingly, the present invention is not intended to be limited by the recitation of the specific embodiments described above, but is to be defined by reference to the appended claims.

What is claimed is:

1. An apparatus having improved noise performance and wide-tuning-frequency and high-voltage capabilities, the apparatus comprising:
a monolithic integrated circuit;
an oscillator core of the monolithic integrated circuit, the oscillator core comprising a first bipolar transistor and a second bipolar transistor implemented in a push-push configuration, wherein the first bipolar transistor is configured to generate a first oscillating signal, and wherein the second bipolar transistor is configured to generate a second oscillating signal that is in anti-phase with the first oscillating signal for a fundamental harmonic and in phase with the first oscillating signal for an even harmonic; and
one or more tuning units of the monolithic integrated circuit configured to present the oscillator core with a selectable capacitance, wherein a first tuning unit of the one or more tuning units comprises:
a first capacitor including a first end and a second end, wherein the first end is electrically connected to a first node of the oscillator core;
a second capacitor including a first end and a second end, wherein the first end is electrically connected to a second node of the oscillator core;
two or more field effect transistors (FETs) electrically connected in series between a second end of the first capacitor and a second end of the second capacitor, wherein the two or more FETs comprise a first FET including a source electrically connected to the second end of the first capacitor, a second FET including a source electrically connected to the second end of the second capacitor and a drain electrically connected to a drain of the first FET;
a first resistor including a first end configured to receive a first control signal and a second end electrically connected to the second end of the first capacitor and to the source of the first FET;
a second resistor including a first end configured to receive the first control signal and a second end electrically connected to the second end of the second capacitor and to the source of the second FET;
a third resistor including a first end configured to receive a second control signal and a second end electrically connected to a gate of the first FET; and
a fourth resistor including a first end configured to receive the second control signal and a second end electrically connected to a gate of the second FET,
wherein the fundamental harmonic is based at least partly on the selected capacitance presented by the one or more tuning units.

2. The apparatus of claim 1, wherein the first and second bipolar transistors are implemented in a common collector configuration.

3. The apparatus of claim 1, further comprising:
a voltage-controlled capacitor operatively coupled to the oscillator core, the voltage-controlled capacitor having an adjustable capacitance;
wherein the fundamental harmonic is based at least partly on the selectable capacitance presented by the one or more tuning units and on the capacitance of the variable capacitor.

4. The apparatus of claim 1, wherein the oscillator core is configured to generate a third oscillating signal that has a frequency substantially twice the frequency of the fundamental harmonic.

5. The apparatus of claim 1, further comprising a control unit operatively coupled to the oscillator core and to the one or more tuning units, wherein the control unit is configured to adjust the selectable capacitance to match one of the harmonics of the first oscillating signal to a reference frequency.

6. The apparatus of claim 1, wherein the monolithic integrated circuit is provided a supply voltage, the two or more FETs have an aggregate breakdown voltage greater than twice the supply voltage.

7. The apparatus of claim 1, wherein the first tuning unit further comprises:
a fifth resistor including a first end configured to receive the first control signal and a second end electrically connected to the drain of the first FET and to the drain of the second FET.

8. The apparatus of claim 7, wherein the first tuning unit further comprises:
a sixth resistor including a first end electrically connected to a body of the first FET and a second end electrically connected to a first voltage; and
a seventh resistor including a first end electrically connected to a body of the second FET and a second end electrically connected to the first voltage.

9. The apparatus of claim 1, wherein the oscillator core further comprises:
a third capacitor including a first end electrically connected to the first node and a second end electrically connected to a base of the first bipolar transistor; and
a fourth capacitor including a first end electrically connected to the second node and a second end electrically connected to a base of the second bipolar transistor.

10. An apparatus having improved noise performance and wide-tuning-frequency and high-voltage capabilities, the apparatus comprising:
a monolithic integrated circuit;
an oscillator core of the monolithic integrated circuit, the oscillator core comprising a first bipolar transistor and a second bipolar transistor implemented in a push-push configuration, wherein the first bipolar transistor is configured to generate a first oscillating signal, and wherein the second bipolar transistor is configured to generate a second oscillating signal that is in anti-phase with the first oscillating signal for a fundamental harmonic and in phase with the first oscillating signal for an even harmonic; and
one or more tuning units of the monolithic integrated circuit configured to present the oscillator core with a selectable capacitance, wherein a first tuning unit of the one or more tuning units comprises:
a first capacitor including a first end and a second end, wherein the first end is electrically connected to a first node of the oscillator core;
a second capacitor including a first end and a second end, wherein the first end is electrically connected to a second node of the oscillator core; and
two or more field effect transistors (FETs) electrically connected in series between a second end of the first capacitor and a second end of the second capacitor,
wherein the fundamental harmonic is based at least partly on the selected capacitance presented by the one or more tuning units,
wherein the oscillator core further comprises a first resistor and a first inductor electrically connected in series between an emitter of the first bipolar transistor and a first voltage, a second resistor and a second inductor electrically connected in series between an emitter of the second bipolar transistor and the first voltage, a third capacitor including a first end electrically connected to the first node and a second end electrically connected to a base of the first bipolar transistor, a fourth capacitor including a first end electrically connected to the second node and a second end electrically connected to a base of the second bipolar transistor, and a fifth capacitor and a sixth capacitor electrically connected in series between the emitter of the first bipolar transistor and the emitter of the second bipolar transistor,
wherein the emitter of the first bipolar transistor is configured to generate the first oscillating signal, and
wherein the emitter of the second bipolar transistor is configured to generate the second oscillating signal.

11. The apparatus of claim 10,
wherein the fifth capacitor includes a first end electrically connected to the emitter of the first bipolar transistor and a second end,
wherein the sixth capacitor includes a first end electrically connected to the emitter of the second bipolar transistor and a second end, and
wherein the oscillator core further comprises a seventh capacitor including a first end electrically connected to the second ends of the fifth and sixth capacitors and a second end configured to generate a third oscillating signal that has a frequency substantially twice the frequency of the fundamental harmonic.

12. An apparatus having improved noise performance and wide-tuning-frequency and high-voltage capabilities, the apparatus comprising:
a monolithic integrated circuit;
an oscillator core of the monolithic integrated circuit, the oscillator core comprising a first bipolar transistor and a second bipolar transistor implemented in a push-push configuration, wherein the first bipolar transistor is configured to generate a first oscillating signal, and wherein the second bipolar transistor is configured to generate a second oscillating signal that is in anti-phase with the first oscillating signal for a fundamental harmonic and in phase with the first oscillating signal for an even harmonic; and
one or more tuning units of the monolithic integrated circuit configured to present the oscillator core with a selectable capacitance, wherein a first tuning unit of the one or more tuning units comprises:
a first capacitor including a first end and a second end, wherein the first end is electrically connected to a first node of the oscillator core;
a second capacitor including a first end and a second end, wherein the first end is electrically connected to a second node of the oscillator core; and
two or more field effect transistors (FETs) electrically connected in series between a second end of the first capacitor and a second end of the second capacitor,
wherein the fundamental harmonic is based at least partly on the selected capacitance presented by the one or more tuning units,
wherein the oscillator core further comprises:
a third capacitor including a first end electrically connected to the first node and to a collector of the first bipolar transistor and a second end electrically connected to an emitter of the first bipolar transistor; and
a fourth capacitor including a first end electrically connected to the second node and to a collector of the second bipolar transistor and a second end electrically connected to an emitter of the second bipolar transistor,
wherein the emitter of the first bipolar transistor is configured to generate the first oscillating signal, and wherein the emitter of the second bipolar transistor is configured to generate the second oscillating signal.

13. The apparatus of claim 12, wherein the oscillator core further comprises:
   a first resistor and a first inductor electrically connected in series between the emitter of the first bipolar transistor and a first voltage; and
   a second resistor and a second inductor electrically connected in series between the emitter of the second bipolar transistor and the first voltage.

14. The apparatus of claim 13, wherein the oscillator core further comprises a fifth capacitor and a sixth capacitor electrically connected in series between the emitter of the first bipolar transistor and the emitter of the second bipolar transistor.

* * * * *